United States Patent
Kajikawa et al.

(10) Patent No.: US 6,172,572 B1
(45) Date of Patent: *Jan. 9, 2001

(54) DIELECTRIC RESONATOR, DIELECTRIC FILTER, DIELECTRIC DUPLEXER, AND OSCILLATOR

(75) Inventors: Takehisa Kajikawa, Osaka; Koichi Sakamoto, Otsu; Sadao Yamashita, Kyoto, all of (JP)

(73) Assignee: Murata Manufacturing Co., Ltd. (JP)

( * ) Notice: Under 35 U.S.C. 154(b), the term of this patent shall be extended for 0 days.

This patent is subject to a terminal disclaimer.

(21) Appl. No.: 09/319,823

(22) PCT Filed: Dec. 5, 1997

(86) PCT No.: PCT/JP97/04454

§ 371 Date: Jul. 13, 1999

§ 102(e) Date: Jul. 13, 1999

(87) PCT Pub. No.: WO98/26470

PCT Pub. Date: Jun. 18, 1998

(30) Foreign Application Priority Data

Dec. 12, 1996 (JP) ...... 8-332376
Feb. 26, 1997 (JP) ...... 9-42392

(51) Int. Cl.$^7$ ...... H03B 5/18
(52) U.S. Cl. ...... 331/96; 331/117 D; 333/219.1; 333/202; 333/134
(58) Field of Search ...... 331/96, 117 D, 331/107 DP, 115; 333/219, 219.1, 202, 134

(56) References Cited

U.S. PATENT DOCUMENTS

| 4,575,699 | * | 3/1986 | Lockwood | 333/219 |
| 5,764,116 | * | 6/1998 | Ishikawa et al. | 333/202 |
| 5,786,740 | * | 1/2000 | Ishikawa et al. | 333/219.1 |
| 6,016,090 | * | 1/2000 | Iio et al. | 333/202 |

FOREIGN PATENT DOCUMENTS

| 51-134548 | 11/1976 | (JP) . |
| 53-83556 | 7/1978 | (JP) . |
| 54-18260 | 2/1979 | (JP) . |
| 62-71305 | 4/1987 | (JP) . |
| 1-144801 | 6/1989 | (JP) . |
| 8-265015 | 10/1996 | (JP) . |

OTHER PUBLICATIONS

Ishikawa, et al., "Planar Type Dielectric Resonator Filter at Millimeter–Wave Frequency", *IEICE Trans. Electron.*, vol. E79–C, No. 5, May 1996, pp. 679–684.

Ishikawa, et al., "Planer Circuit 60GHz Dielectric Resonator Using High Dielectric Constant Substrate", *Electronics Society Convention of IEICE*, 1995, Paper C–132.

Ishikawa, et al., "Millimeter–Wave Filter 1 (Planer Circuit Dielectric Filter)", *Papers of Technical Meeting on Electronic Devices*, EDD–95–54, 1995, pp. 83–92.

* cited by examiner

*Primary Examiner*—Benny Lee
*Assistant Examiner*—Henry Choe
(74) *Attorney, Agent, or Firm*—Ostrolenk, Faber, Gerb & Soffen, LLP

(57) ABSTRACT

A dielectric resonator allowing size reduction and easy modulation of coupling between adjacent resonating sections and electrodes is provided. A configuration is such that electric conductors 2a and 2b having openings on two main faces of a dielectric substrate 2 are arranged so as to oppose each other. Electrodes 5 and 6 are respectively formed on one main face each of supporting members 3a and 3b, the supporting members 3a and 3b are arranged via spacers 9 so as to oppose each other and so as to be apart from each other with a predetermined spacing in the thickness direction of the dielectric substrate 2 for the dielectric substrate 2, first and second conductor plates 4a and 4b are arranged apart with a predetermined spacing from the supporting members 3a and 3b, and the dielectric substrate positioning between the openings opposing each other is used as a resonating section.

31 Claims, 13 Drawing Sheets

DIELECTRIC RESONATOR, DIELECTRIC FILTER, DIELECTRIC DUPLEXER, AND OSCILLATOR

TECHNICAL FIELD

The present invention relates to a dielectric resonator, a dielectric filter, a dielectric duplexer, and an oscillator.

BACKGROUND ART

Recently, a sharply increasing demand for and multimedia-systemization of mobile communication systems requires large-scale and high-speed communication systems. According to the increasing amount of information to be communicated, frequency bands to be used are being widened from microwave bands to millimeter-wave (milliwave) bands. In such milliwave bands, conventionally-known TE01δ-mode dielectric resonators composed of a cylindrical dielectric device can be used in a manner similar to the case of microwave bands. In this case, since the frequency of the TE01δ-mode dielectric resonator is defined according to the outer dimension of the cylindrical dielectric device, strict processing accuracy is required.

Also, suppose a dielectric filter is configured by arranging a plurality of the TE01δ-mode dielectric resonators to be apart from each other with a predetermined spacing in a metal housing. In such a case, coupling between an input/output means such as a metal loop and a dielectric resonator or between a dielectric resonator and a dielectric resonator is determined according to the distance therebetween. Therefore, the arrangement requires high positional accuracy.

Then, in Japanese Unexamined Patent Application Publication No. 7-62625, U.S. Pat. No. 5,764,116 the present applicant proposed a dielectric resonator and a dielectric filter that allow improved processing accuracy, solving the problems described above.

The dielectric filter according to the above patent application is shown FIG. 12. FIG. 12 is an exploded perspective view of the dielectric filter according to the above patent application.

As shown in FIG. 12, a dielectric filter 101 is constituted of a dielectric substrate 102 and conductor plates 104a and 104b.

The dielectric substrate 102 has a constant relative dielectric constant, on which electric conductors 102a and 102b having circular openings on their two main faces are formed so that that the openings on the two main faces oppose each other.

An input coplanar line 105a and an output coplanar line 105b are formed so as to be in proximity to two ends of the five openings on one of the main faces of the dielectric substrate 102 (the upper side in FIG. 12).

The dielectric plates 104a and 104b are immobilized such that they are spaced apart by a predetermined distance from the dielectric substrate 102 and so that they sandwich the dielectric substrate 102. The input coplanar line 105a and the output coplanar line 105B are projected from the dielectric plates 104a and 104b. Cutouts are arranged on the conductor plate 104a so that the input coplanar line 105a and the output coplanar line 105b are not connected. The conductor plate 104a and the electric conductor 102a of the dielectric substrate 102 are electrically connected, and the conductor plate 104b and the electric conductor 102b of the dielectric substrate 102 are electrically connected.

In the configuration as described above, electromagnetic-field energy is confined in the dielectric substrate 102 in the vicinity sandwiched by the openings opposing the electric conductors 102a and 102b, and five resonating sections are formed. Further adjacent resonating sections are coupled; thus, a dielectric filter having resonating sections in five steps is configured.

As described above, the resonating section can be defined according to the size of the opening of an electrode. This enables a processing means such as etching to be used in production and allows production of a dielectric resonator, a dielectric filter, and the like that have precisely reproduced dimensional accuracy of the resonating section.

In the dielectric filter 101 as described above, confinement of electromagnetic-field energy is high in the resonating sections formed by the dielectric substrate 102 sandwiched by the openings on the opposing electric conductors 102a and 102b. Therefore, when an input/output terminal means is formed of the coplanar lines 105a and 105b, coupling is weak between the resonating sections and the input/output terminal means. Therefore the distance between the openings of the electrodes 102a and 102b and the input coplanar lines 104a and 104b is shortened as much as possible so as to strengthen coupling between the resonating sections and the input/output terminal means.

Also, in the dielectric filter 101 as described above, since confinement of electromagnetic-field energy is high in the resonating sections, coupling is weak between the adjacent resonating sections. Therefore the distance between the openings is shortened as much as possible so as to strengthen coupling between the resonating sections.

In addition, a conventionally as an apparatus using a dielectric resonator, namely a voltage-controlled oscillator, is shown in FIG. 13.

As shown in FIG. 13, a voltage-controlled oscillator 111 uses a cylindrical TE01δ-mode dielectric resonator 112.

The TE01δ-mode dielectric resonator 112 is mounted on a wiring substrate 113 via a supporting base 112a. On a lower face of the wiring substrate 113, ground electrodes, not shown, are formed. The wiring substrate 113 is housed within an upper metal housing 130 and a lower metal housing 131.

On the wiring substrate 113, a microstrip line 114 composing a primary line and a microstrip line 115 composing a secondary line are formed so as to overlap each other as viewed downward from points over the TE01δ-mode dielectric resonator 112 and FIG. 13.

The microstrip line 114 is arranged such that one end thereof is connected to a ground electrode 117 via a chip resistor 116, and the other end thereof is connected to a gate of a field-effect transistor 118.

A resonating section is formed by electromagnetic-field coupling between the primary line composing the primary line and the TE01δ-mode dielectric resonator 112.

The microstrip line 115 is arranged such that one end thereof is connected to the ground electrode 117 via a varactor diode 119, and the other end thereof is an open end.

A variable oscillation frequency circuit is comprised of the microstrip line 115 composing the primary line and the varactor diode 119.

The field-effect transistor 118 is arranged such that a drain thereof is connected to an input terminal 122 via a microstrip line 121, and a source thereof is connected to one end of a microstrip line 123.

The microstrip line 121 is connected to a matching stub 124 at a point of connection with the drain of the field-effect transistor 118.

The other end of the microstrip line 123 is connected to the ground electrode 117 via a chip resistor 125. The microstrip 123 is formed so as to be parallel from a point with a microstrip line 126 with a constant distance so as to be electrically coupled.

The microstrip line 126 is connected to an output terminal electrode 128 via a chip resistor 127.

The matching stub 124 is connected to the input terminal electrode 122 in parallel with the microstrip line 121.

A chip capacitor 129 is connected to the output terminal electrode 128 in parallel with the chip resistor 127.

In a configuration such as that described above, the varactor diode 119 serves as a variable capacitor according to application voltages to vary resonance frequency, by which oscillation frequency varies.

As described above, in the dielectric filter 101 shown in FIG. 12, the distance between the openings of the electric conductors 102a and 102b and the input and output coplanar lines 105a and 105b is shortened as much as possible so as to strengthen coupling between the resonating sections and the input/output terminal means.

However, because of a limit to shortening of the distance between the openings of the electric conductors 102a and 102b and the input and output coplanar lines 105a and 105b, the coupling strength cannot be further increased.

Also, the length of the dielectric substrate 102 is increased in the direction of the resonating-section arrangement by formation of the input/output coplanar lines 105a and 105b, increasing the overall length of the dielectric filter 101. Therefore, the space for the input/output terminal means such as the input/output coplanar lines 105a and 105b is an obstacle to reducing the overall size of the dielectric filter 101.

Also, as shown in FIG. 12, when the dielectric filter having five-step resonating sections is so configured, five openings must be formed on the electric conductors 102a and 102b on the two main faces of the dielectric substrate 102. Accordingly, the overall size of the dielectric substrate 102 is increased, and as a result, the overall size of the dielectric filter 101 is increased. Therefore, the overall size of the dielectric filter is increased in proportion to the increase in the number of the openings on the electric conductors formed on the two main faces of the dielectric substrate, that is, the number of steps in the resonating sections.

Also, characteristics of the individual resonating section in the dielectric filter, such as frequency characteristics, are adjusted by eliminating electric conductors in the vicinity of the openings on the electrodes forming the resonating sections. However, since this changes the shape of the openings, electromagnetic fields are caused to diverge, and unnecessary spurious components are occasionally produced.

Also, when coupling between the individual resonating sections in the dielectric filter must be strengthened, the distance between the openings in the electric conductor of the electric conductor is shortened. That is, a different dielectric substrate having a smaller distance between openings of the electric conductor is used, and a different dielectric substrate must be prepared. This takes time and incurs costs.

Also, to adjust characteristics of the dielectric filter, for example, to indirectly couple resonating sections separated from each other, a different capacitor, a coil, and the like, and circuit elements such as lead lines formed on the dielectric substrate 102 are arranged on the dielectric substrate 102.

Also, to arrange these circuit elements on the dielectric substrate 102, lead lines for arranging them are also formed on the same substrate. When such lead lines are formed around the resonating sections, however, the dimensions of the substrate used must be larger, the size of the dielectric device is increased, and the overall size of the dielectric filter is also increased.

In addition, in the voltage-controlled oscillator 111, electromagnetic fields of the TE01δ-mode dielectric resonator 112 are widely dispersed around the TE01δ-mode dielectric resonator 112. Therefore, a problem arises in that the electromagnetic fields couple to the microstrip lines 121 and 123 and the like, instead of the microstrip line 114 and the microstrip line 115. When such unnecessary coupling occurs, the oscillation frequency in the voltage-controlled oscillator 111 may be unstable. Conventionally, to minimize defects due to such unnecessary coupling, wiring was designed so that the microstrip lines 121 and 123 which is not desired to be coupled to the TE01δ-mode dielectric resonator 112 are separated as far as possible from the TE01δ-mode dielectric resonator 112.

However, separation of microstrip lines other than the primary line and secondary line requires the wiring substrate 113 to be enlarged proportionally to the separation, resulting in enlargement of the overall size of the voltage-controlled oscillator 111.

Also, since wiring is designed under the condition that the microstrip lines 121 and 123 which are not desired to be coupled to the TE01δ-mode dielectric resonator 112 are separated as far as possible from the TE01δ-mode dielectric resonator 112, less flexibility remains in the wiring design.

Also, the TE01δ-mode dielectric resonator 112 is arranged on the wiring substrate 113, and the wiring substrate 113 is covered by the upper metal housing 130 so as to confine electromagnetic fields in the TE01δ-mode dielectric resonator 112. In this case, the height of the upper metal housing 130 must be made larger than that of the TE01δ-mode dielectric resonator 112. This also increases the height of the voltage-controlled oscillator 111.

DISCLOSURE OF INVENTION

The present invention is made in consideration of the these problems and has an object to provide a dielectric resonator, a dielectric filter, a dielectric duplexer, and an oscillator that allow overall size reduction, easy adjustment of coupling between resonators adjacent to each other, and flexible wiring design.

Accordingly, a dielectric resonator according to an aspect of the invention includes a dielectric substrate, a first electric conductor formed on one main face of the dielectric substrate, a second electric conductor formed on the other main face of the dielectric substrate, a first opening formed on the first electric conductor so that the dielectric substrate is exposed by the first electric conductor, a second opening formed on the second electric conductor so that the dielectric substrate is exposed by the second electric conductor, a first electric conductor plate spaced apart from the first electric conductor so as to cover at least the first opening, a second electric conductor plate spaced apart from the second electric conductor so as to cover at least the second opening, a resonating section defined by the first opening and the second opening, a supporting member spaced apart from the dielectric substrate in the thickness direction of the dielectric substrate, and electrodes formed on the supporting member.

In a dielectric resonator according to an aspect of the invention, a plurality of the supporting members is arranged in the thickness direction of the dielectric substrate for the dielectric substrate.

In a dielectric resonator according to an aspect of the invention, lead lines are arranged by the electrodes.

In a dielectric resonator according to an aspect of the invention, the electrodes are used as frequency-modulating electrodes.

A dielectric filter according to an aspect of the invention includes a dielectric substrate, a first electric conductor formed on one main face of the dielectric substrate, a second electric conductor formed on the other main face of the dielectric substrate, a first opening formed on the first electric conductor so that the dielectric substrate is exposed by the first electric conductor, a second opening formed on the second electric conductor so that the dielectric substrate is exposed by the second electric conductor, a first conductor plate spaced apart from the first electric conductor so as to cover at least the first opening, a second electric conductor plate spaced apart from the second electric conductor so as to cover at least the second opening, a resonating section defined by the first opening and the second opening, a supporting member spaced apart from the dielectric substrate in the thickness direction of the dielectric substrate, and electrodes formed on the supporting member.

In a dielectric filter according to an aspect of the invention, input/output terminal electrodes for performing electromagnetic-field coupling are arranged by the electrodes at the resonating sections.

In a dielectric filter according to an aspect of the invention, the electrodes are used as frequency-modulating electrodes.

In a dielectric filter according to an aspect of the invention, the supporting member is a dielectric substrate, the electrodes are formed on two main faces of the supporting member, openings are formed on the electrodes on the two main faces, and a resonating section is formed by the openings.

In a dielectric filter according to an aspect of the invention, a plurality of the first openings and a plurality of the second openings exist, so that a plurality of the resonating sections defined by the first openings and the second resonating sections exist.

In a dielectric filter according to an aspect of the invention, coupling electrodes for coupling the plurality of resonating sections via an electromagnetic field are formed on the supporting member.

In a dielectric filter according to an aspect of the invention, a plurality of the supporting members is arranged in the direction of the dielectric substrate with respect the dielectric substrate.

A dielectric duplexer according to an aspect of the invention, includes a dielectric substrate, a first electric conductor formed on one main face of the dielectric substrate, a second electric conductor formed on the other main face of the dielectric substrate, a plurality of first openings formed on the first electric conductor,
 a plurality of second openings formed on the second electric conductor, a first conductor plate spaced apart from the first electric conductor so as to cover at least the plurality of first openings, a second conductor plate spaced apart from the second electric conductor so as to cover at least the plurality of second openings, a plurality of resonating sections defined by the plurality of first openings and the plurality of second openings, a first filter composed of a first resonating section group of the plurality of resonating sections, a second filter composed of a second resonating section group of the plurality of resonating sections which is different from the first resonating section group, a supporting member spaced apart from the dielectric substrate in the thickness direction of the dielectric substrate, and electrodes formed on the supporting member.

A dielectric duplexer according to an aspect of the invention includes a first input/output terminal electrode composed of the electrode and coupled to at least one of the first resonating section group via an electromagnetic field, a second input/output terminal electrode composed of the electrode and coupled to at least one of the second resonating section group via an electromagnetic field, and a third input/output terminal electrode composed of the electrode and coupled to at least one of the first resonating section group and to at least one of the second resonating section group via an electromagnetic field.

In a dielectric duplexer according to an aspect of the invention, the electrodes are used as frequency-modulating electrodes.

In a dielectric duplexer according to an aspect of the invention, the supporting member is a dielectric substrate, the electrodes are formed on two main faces of the supporting member, openings are formed on the electrodes on the two main faces, and a resonating section is formed by the openings.

In a dielectric duplexer according to an aspect of the invention, a plurality of the first openings and a plurality of the second openings exist, so that a plurality of the resonating sections defined by the first openings and the second resonating sections exist.

In a dielectric duplexer according to an aspect of the invention, coupling electrodes for coupling the plurality of resonating sections via an electromagnetic field are formed on the supporting member.

In a dielectric duplexer according to an aspect of the invention, a plurality of the supporting members is arranged in the direction of the dielectric substrate with respect the dielectric substrate.

An oscillator according to an aspect of the invention, includes a dielectric substrate, a first electric conductor formed on one main face of the dielectric substrate, a second electric conductor formed on the other main face of the dielectric substrate, a first opening formed on the first electric conductor, a second opening formed on the second electric conductor, a first electric conductor plate spaced apart from the first electric conductor so as to cover at least the first opening, a second electric conductor plate spaced apart from the second electric conductor so as to cover at least the second opening, a resonating section defined by the first opening and the second opening, a supporting member spaced apart from the dielectric substrate in the thickness direction of the dielectric substrate, a primary line formed on the supporting member and composing a resonant circuit by performing electromagnetic-field coupling to the resonating section, and a negative resistor circuit connected to the resonant circuit.

In an oscillator according to an aspect of the invention, the resonant circuit includes an oscillation frequency variable circuit.

In an oscillator according to an aspect of the invention, the oscillation frequency variable circuit is controlled by voltage.

In an oscillator according to an aspect of the invention, at least either one of the first electric conductor and the second electric conductor of the dielectric substrate is connected to the first conductor plate or the second conductor plate. In an oscillator according to an aspect of the invention, the first electric conductor and the second electric conductor of the dielectric substrate are connected.

Configurations such as those described above allow provision of a dielectric resonator, a dielectric filter, a dielectric duplexer, and an oscillator that allow overall size reduction, easy adjustment of coupling between resonators adjacent to each other, and flexible wiring design.

BEST MODE FOR CARRYING OUT THE INVENTION

Figure 1:
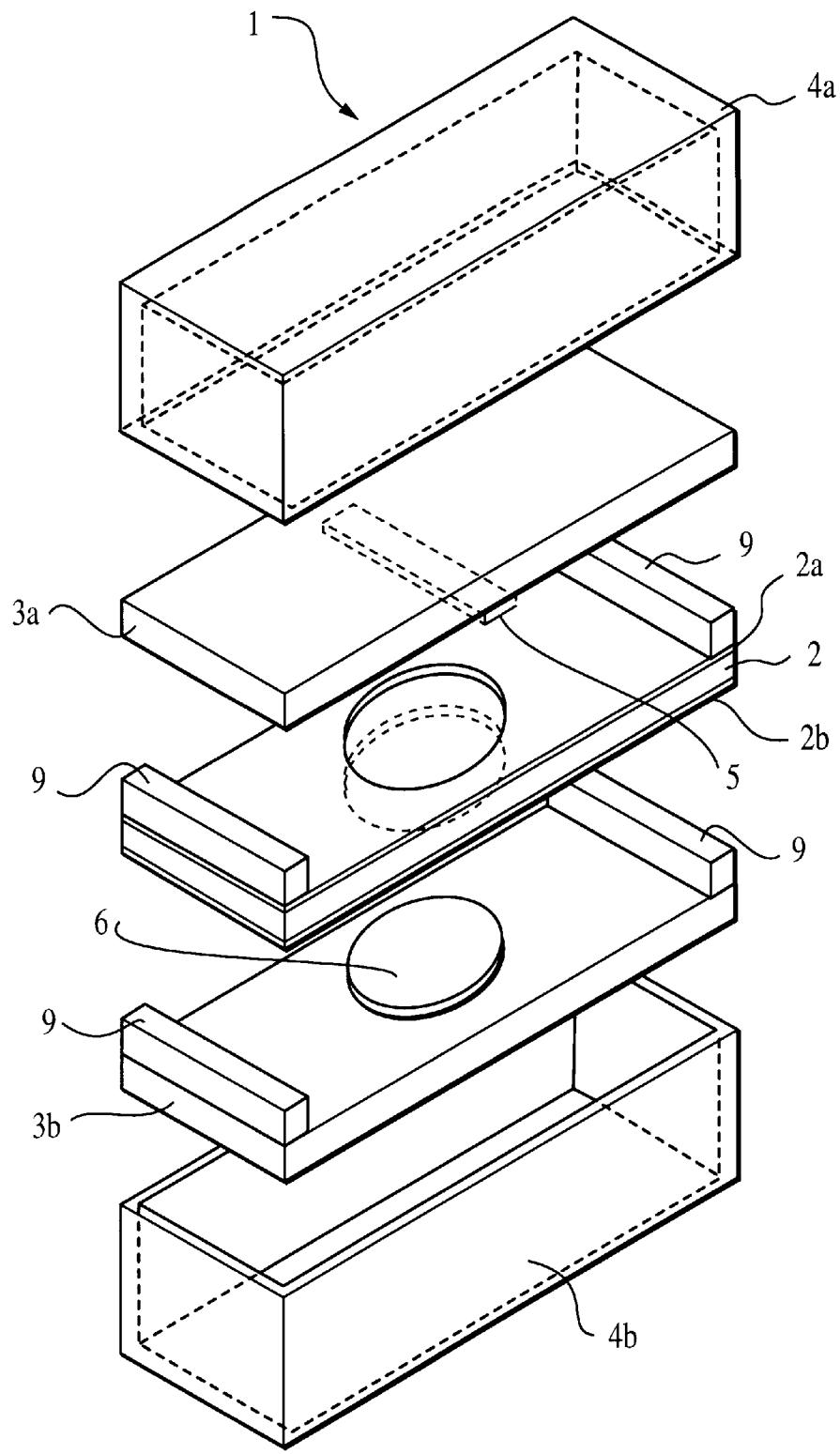
FIG. 1 is an exploded perspective view of a dielectric resonator according to a first embodiment.

Using FIG. 1, a first embodiment of the present invention is described below. FIG. 1 is an exploded perspective view of a dielectric resonator according to a first embodiment of the present invention.

As shown in FIG. 1, a dielectric resonator 1 is composed of a dielectric substrate 2, supporting members 3a and 3b, and conductor plates 4a and 4b.

The dielectric substrate 2 has a constant relative dielectric constant, on which electric conductors 2a and 2b having circular openings on their two main faces are formed so that the openings on the two main faces oppose each other. The size of the openings in the electric conductors 2a and 2b of the dielectric substrate 2 is defined in accordance with a predetermined frequency. By these openings, a resonating section is arranged.

The supporting member 3a is an insulating substrate arranged parallel with the dielectric substrate 2. Also, the supporting member 3a has an electrode 5 formed on its face opposing the dielectric substrate 2. The electrode 5 functions as a lead line and is coupled to the openings in the electric conductors 2a and 2b of the dielectric substrate 2 via electromagnetic fields.

The supporting member 3b is an insulating substrate, is similar to the supporting member 3a, and is arranged parallel with the dielectric substrate 2 at a side different from the supporting member 3a. The supporting member 3a has an electrode 6 formed on its face opposing the dielectric substrate 2. The electrode 6 functions as a frequency-modulating electrode, and increasing or reducing the area of the electrode 6 allows modulation of resonant frequency in the resonating section formed on the opposing dielectric substrate.

In order to hold the dielectric substrate 2 and the supporting members 3a and 3b at a constant spacing, spacers 9 are arranged individually between the dielectric substrate 2 and the supporting member 3a and between the dielectric substrate 2 and the supporting member 3b.

In the configuration as described above, the openings and the dielectric substrate sandwiched thereby operate as a resonating section, providing the dielectric resonator 1 having one resonating section. Also, this embodiment allows for a configuration in which the electrodes are close to the openings, providing stronger coupling, compared to a configuration in which electrodes and a resonating section are formed on the same substrate. In addition, compared to a configuration in which electrodes and a resonating section are formed on the same substrate, since the lead lines are formed on a different substrate, the dimension in the horizontal direction can thereby be made smaller.

Figure 2:
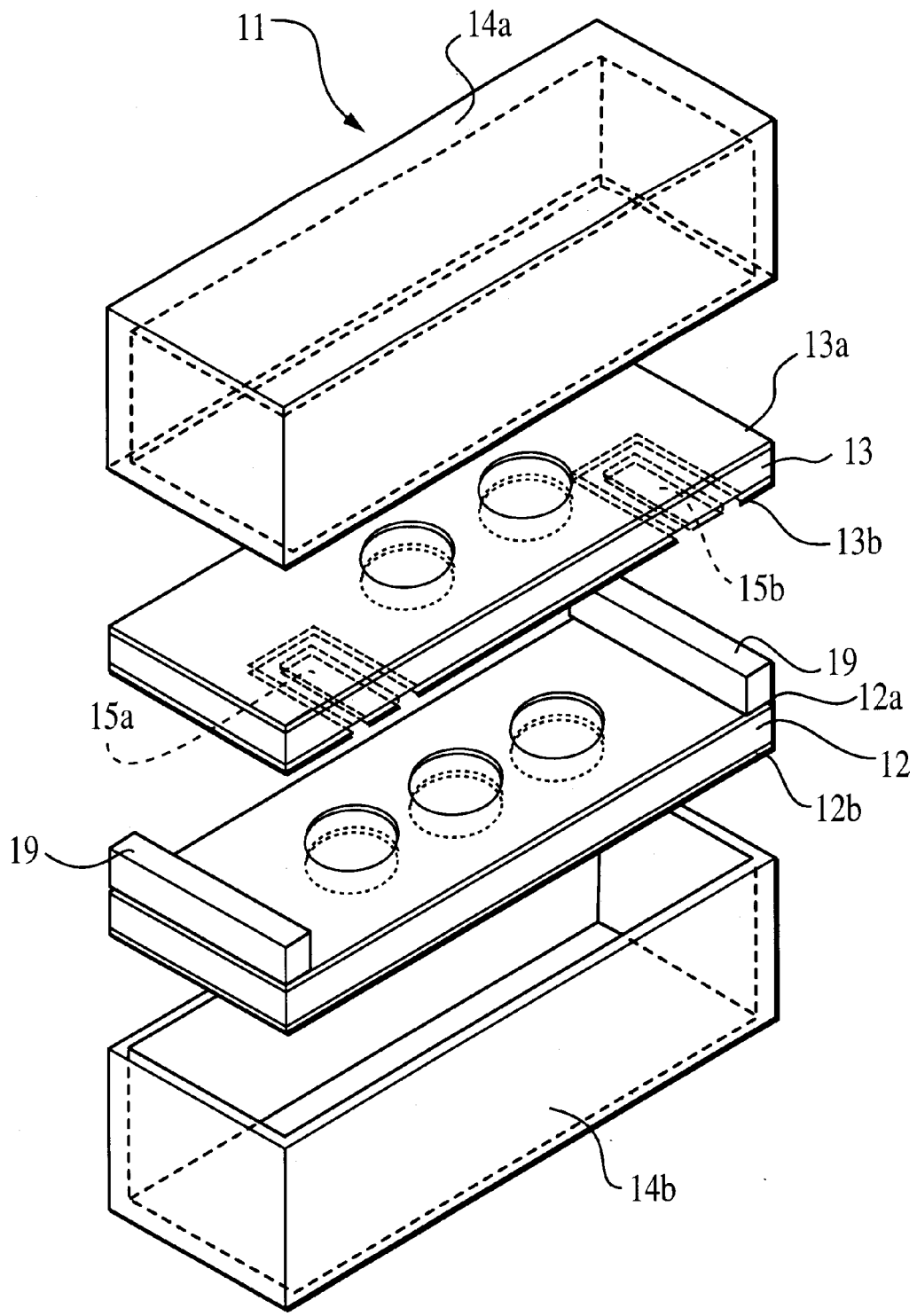
FIG. 2 is an exploded perspective view of a dielectric filter according to a second embodiment.

Next, a second embodiment is described below using FIG. 2. FIG. 2 is an exploded perspective view of a dielectric filter according to the second embodiment of the present invention.

As shown in FIG. 2, a dielectric filter 11 is composed of a dielectric substrate 12, a supporting member 13, and dielectric plates 14a and 14b.

The dielectric substrate 12 has a constant relative dielectric constant, on which electric conductors 12a and 12b having three circular openings on their two main faces are formed so that the openings on the two main faces oppose each other. The size of the openings in the electric conductors 12a and 12b of the dielectric substrate 12 is defined in accordance with a predetermined frequency.

Similarly to the dielectric substrate 12, the supporting member 13 has a constant relative dielectric constant, on which electrodes 13a and 13b having two circular openings on their two main faces are formed so that the openings on the two main faces oppose each other. In the same manner as in the dielectric substrate 12, the size of the openings in the electrodes 3a and 3b of the supporting member 13 is also defined in accordance with a predetermined frequency.

The supporting member 13 is arranged at a constant spacing from the dielectric substrate 12, in which each of the two openings in the electrode 13b overlaps with two of the three openings in the dielectric substrate 12 of the electric conductor 12a. In order to hold the dielectric substrate 12 and the supporting member 13 at a constant spacing, spacers 19 and 19 are arranged between the dielectric substrate 12 and the supporting member 13.

An input coplanar line 15a and an output coplanar line 15b are formed at both end portions on the side of electrode 13b of the supporting member 13. The input coplanar line 15a is arranged in a position overlapping with one of the two ends of the three openings in the electric conductor 12a of the dielectric substrate 12. The output coplanar line 15b is arranged in the position overlapping with one of the two ends of the three openings in an electric conductor 12a of the dielectric substrate 12.

The dielectric plates 14a and 14b are immobilized such that they are apart at a predetermined distance from the supporting member 13 and so that they sandwich the dielectric substrate 12 and the supporting member 13. The input coplanar line 15a and the output coplanar line 15b are projected from the dielectric plates 14a and 14b.

In the configuration as described above, the openings and the dielectric substrate sandwiched thereby operate as a resonating section, so that the dielectric resonator 11 having resonating sections in five steps can be obtained. In this way, for arranging a dielectric filter not only in the five steps but in other multiples of steps in this embodiment, compared to a configuration in which resonating sections in multiple steps are formed on a dielectric substrate, the dimension in the horizontal direction can be made smaller. In addition, the resonating sections formed on the dielectric substrate 12 and the resonating sections formed on the supporting member 13 are alternatively connected. In this arrangement, coupling between the resonating sections can therefore be varied by changing the distance between the dielectric substrate 12 and the supporting member 13 or by changing the area in which the resonating sections of the dielectric substrate 2 and the resonating sections of the supporting member 3 overlap with each other. In particularly, compared to a conventional manner in which the distance in the horizontal direction of the adjacent resonating sections on the same substrate is reduced, the distance between the resonating sections can be made smaller by reducing the distance the dielectric substrate 12 and the supporting member 13; therefore, stronger coupling can be obtained.

Figure 3:
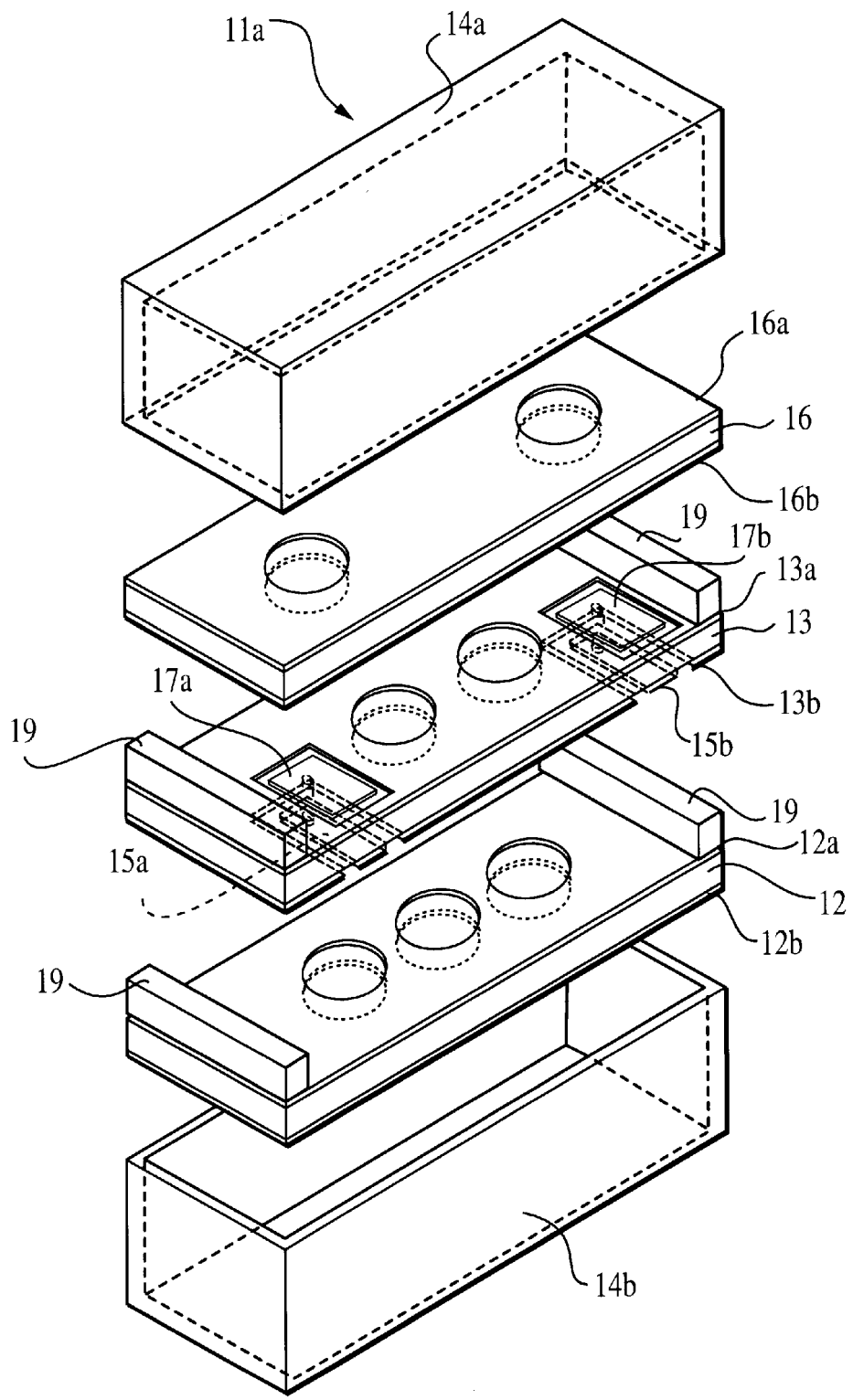
FIG. 3 is an exploded perspective view of a dielectric filter according to a first modification example of the second embodiment.

Using FIG. 2, the description has been made regarding the dielectric filter in which the resonating sections are formed on the two dielectric substrates; however, this is not so restricted; for example, the resonating sections may be individually formed on three substrates, as shown in FIG. 3.

FIG. 3 is an exploded perspective view of a dielectric filter of a first modification example of the second embodiment. For the same parts as those in FIG. 2, the same symbols are given, and a detailed description is omitted.

As shown in FIG. 3, differences from FIG. 2 are that coupling electrodes 17a and 17b are added on the side of an electrode 13a of a supporting member 13, and a supporting member 16 is added.

That is, the coupling electrodes 17a and 17b are formed at two end portions of the electrode 13a on the side of the supporting member 13. The coupling electrode 17a is electrically connected to an input coplanar line 15a via a through-hole; the coupling electrode 17b is electrically connected to an output coplanar line 15b via a through-hole.

The supporting member 16 has a constant relative dielectric constant, on which electrodes 16a and 16b having two circular openings on their two main faces are formed so that the openings on the two main faces oppose each other. The size of the openings in the electrodes 16a and 16b of the supporting member 16 is defined so that frequency at the openings is different from a frequency at openings of electric conductors of a dielectric substrate 12 and from a frequency at openings of the electrodes in the supporting member 13. The two openings in the electrode 16b oppose the coupling electrodes 17a and 17b. In order to hold the supporting member 13 and the supporting member 16 at a constant spacing, spacers 19 are arranged between the supporting member 13 and the supporting member 16. Thus, resonating sections defined by the openings formed on the supporting member 16 are coupled to the coupling electrodes 17a and 17b so as to operate as a trap; therefore, undesired frequency can be attenuated.

By configuring the device, a dielectric resonator 11a having trap resonating sections in two steps and resonating sections in five steps can be obtained.

Figure 4:
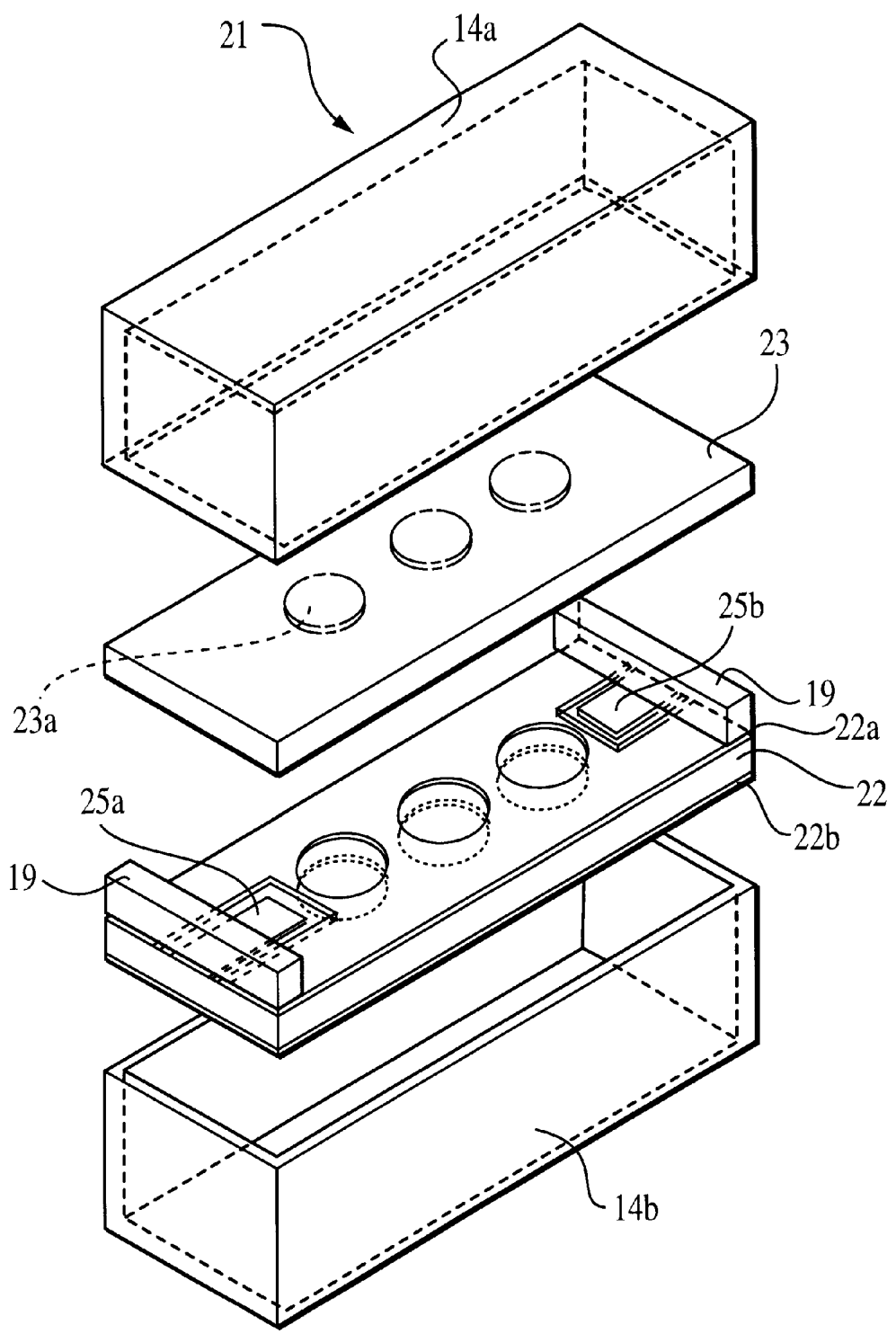
FIG. 4 is an exploded perspective view of a dielectric filter according to a second modification example of the second embodiment.

In addition, using FIG. 4, a second modification example of the second embodiment is described below. FIG. 4 is an exploded perspective view of a dielectric filter of the second modification example of the second embodiment. For the same parts as those in FIG. 2, the same symbols are given, and a detailed description is omitted.

As shown in FIG. 4, a dielectric filter 21 is composed of a dielectric substrate 22, a supporting member 23, and conductor plates 4a and 4b.

The dielectric substrate 22 has a constant relative dielectric constant, on which electric conductors 22a and 22b having three circular openings on their two main faces are formed so that the openings on the two main faces oppose each other. The size of the openings in the electric conductors 22a and 22b of the dielectric substrate 22 is defined in accordance with a predetermined frequency. An input coplanar line 25a and an output coplanar line 25b are formed at both end portions of the dielectric substrate 22.

The supporting member 23 is an insulating substrate arranged such that three circular strip electrodes 23b are formed. The supporting member 23 is arranged at a constant spacing from the dielectric substrate 22, in which one main face thereof having strip electrodes 23b, 23c, 23d which overlap with three openings in the electric conductor 22a.

Also, in order to hold the dielectric substrate 22 and the supporting member 23 at a constant spacing, spacers 9 are arranged individually between the dielectric substrate 22 and the supporting member 23.

In a configuration such as that described above, resonant frequencies at individual resonating sections can be varied by eliminating the strip electrodes 23b in the supporting member 23, adding an electric conductor to the strip electrodes 23b, modifying the distance between the supporting member 23 and the dielectric substrate 22, or in other ways. That is, conventionally, since an electric conductor of a dielectric substrate on which resonating sections are formed is eliminated, divergent electromagnetic field occur to generate unnecessary spurious components. In this embodiment, however, such problems do not arise because the resonating sections are adjusted by the supporting member, which is a member other than the dielectric substrate on which the resonating sections are formed.

Figure 5:
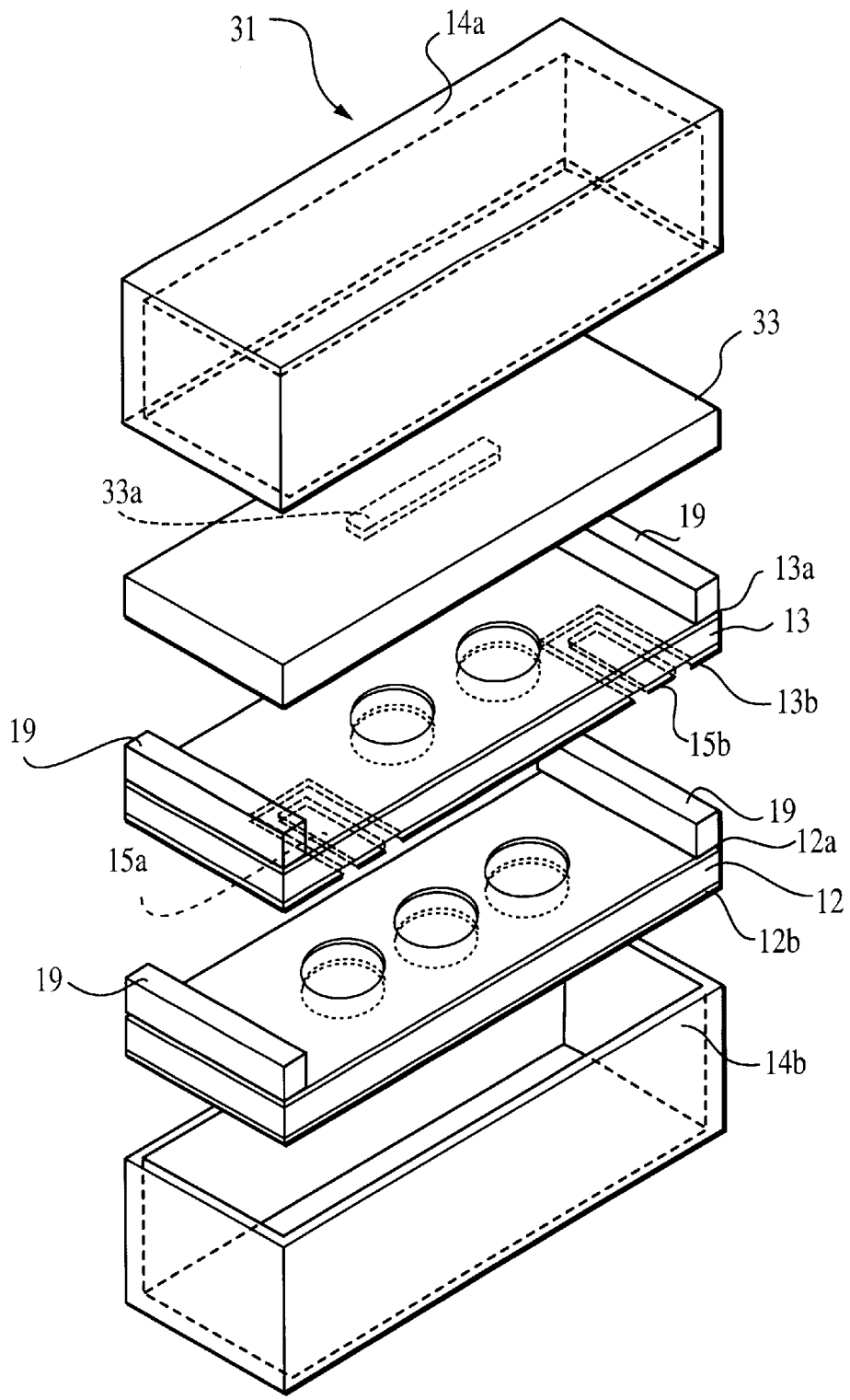
FIG. 5 is an exploded perspective view of a dielectric filter according to a third modification example of the second embodiment.

Next, a third modification example of the second embodiment is described below, using FIG. 5. FIG. 5 is an exploded perspective view of a dielectric filter of the third modification example of the second embodiment. For the same parts as those of the dielectric filter 11a shown in FIG. 3 as the first modification example of the second embodiment, the same symbols are given, and a detailed description is omitted.

The difference from the first modification example of the second embodiment, which is shown in FIG. 3, is that a second supporting member 33 has a strip line in this embodiment, whereas in FIG. 3, the second supporting member 16 has resonating sections similarly to the dielectric substrate 12.

That is, as shown in FIG. 5, a dielectric filter 31 is composed of a dielectric substrate 12, a supporting member 13, the supporting member 33, and dielectric plates 14a and 14b.

The supporting member 33 is an insulating substrate arranged such that one main face thereof has a strip line 33a. The supporting member 33 is arranged at a constant spacing from the dielectric substrate 13, in which the main face thereof having the strip electrode 33a overlapping two openings in an electrode 3a. In order to hold the supporting member 13 and the supporting member 33 at a constant spacing, spacers 19 are arranged individually between the supporting member 13 and the supporting member 33.

By the strip line 33a on this substrate 33, coupling between two resonating sections formed on the supporting member 13 can be obtained.

By configuring the device as above, the resonating sections in the second step and the resonating sections in the fourth steps are indirectly coupled in the dielectric filter 31 composed of resonators in five steps, by which poles can be formed in filter characteristics of the dielectric filter. That is, by setting the poles to an undesirable frequency by adjusting the strength of the indirect coupling, the undesirable frequency can be attenuated.

Figure 6:
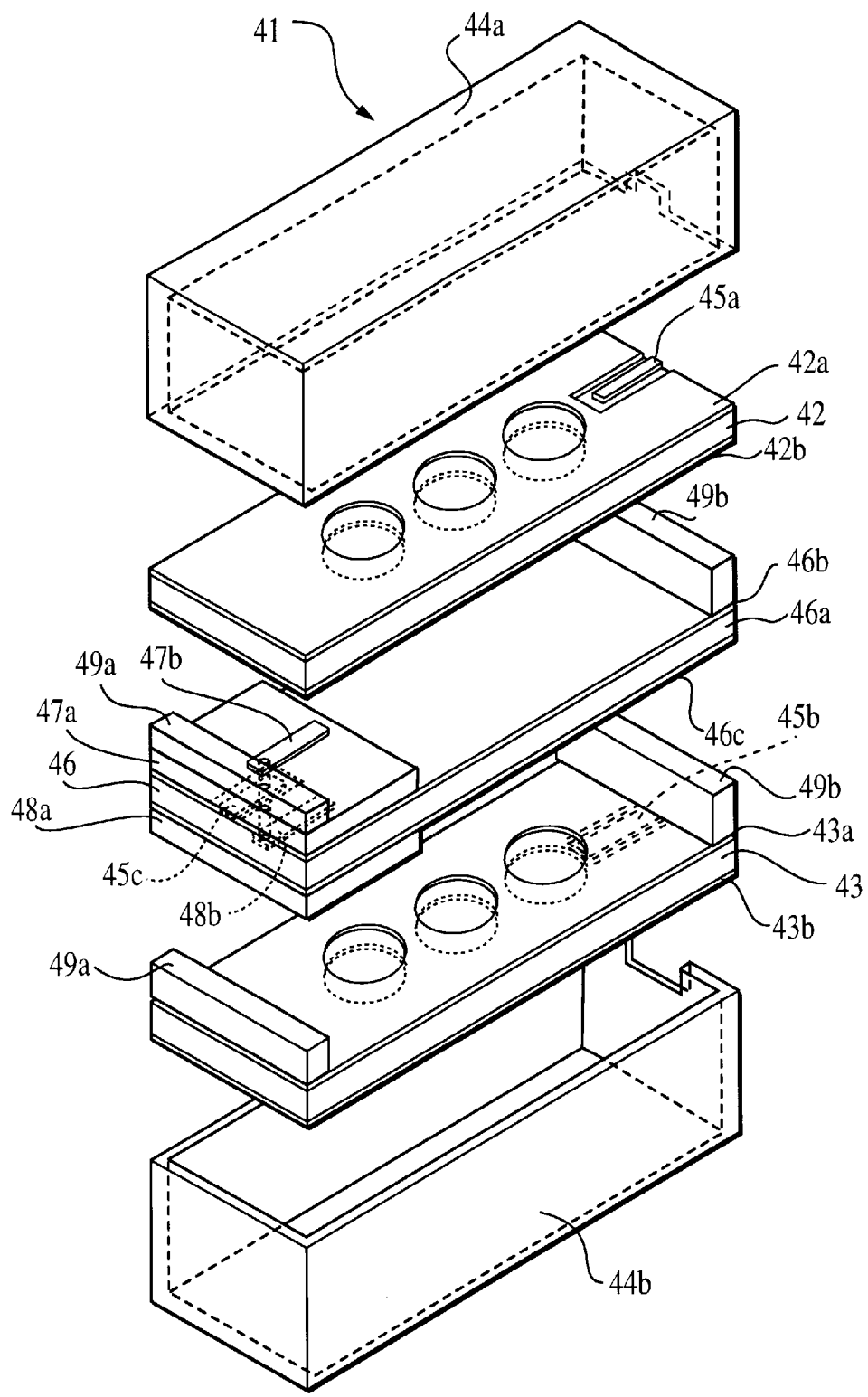
FIG. 6 is an exploded perspective view of a dielectric duplexer according to a third embodiment.

Next, a third embodiment is described below using FIG. 6. FIG. 6 is an exploded perspective view of a dielectric duplexer according to the second embodiment.

As shown in FIG. 6, a dielectric duplexer 41 is composed of dielectric substrates 42 and 43, a supporting member 46, and dielectric plates 44a and 44b.

The dielectric substrate 43 has a constant relative dielectric constant, on which electric conductors 43a and 43b having three circular openings on their two main faces are formed so that the openings on the two main faces oppose each other. The size of the openings in the electric conductors and 42b of the dielectric substrate 42 is defined in accordance with a predetermined frequency. Also, a coplanar line 45a is formed on the side of the electric conductor 42b so as to be in proximity to one of the openings of the two ends.

The dielectric substrate 43 has a constant relative dielectric constant, on which electric conductors 43a and 43b having three circular openings on their two main faces are formed so that the openings on the two main faces oppose each other. The size of the openings in the electric conductors 43a and 43b of the dielectric substrate 43 is defined in accordance with a predetermined frequency. Also, a coplanar line 45b is formed on the side of the electric conductor 43b so as to be in proximity to one of the openings of the two ends.

The supporting member 46 is arranged in a multilayered structure in which electrodes 46b and 46c of a low dielectric constant are formed substantially entirely on two main faces of a supporting substrate 46 of which one end portion has layers of supporting substrates 47a and 48a of a low dielectric constant.

A coplanar line 45c insulated from the electrode 46b is formed in one end portion on the side of electrode 46b formed on the supporting substrate 46a, and a through-hole reaching a face on the side of the electrode 46c is formed at one end of the coplanar line 45c. Around the through-hole on the other face of the supporting substrate 46, the electrode 46c is not formed so that the electrode 46c and the through-hole are not connected.

The supporting substrate 47a is layered on the coplanar line 45c formed on the supporting substrate 46a. A strip line 47b is formed on a face opposing a face that contacts the supporting substrate 46a on the supporting substrate 47a, and a through-hole reaching the other face of the supporting substrate 46a is formed on one end of the strip line 47b. The strip line 47b is connected to the coplanar line 45c via the through-hole.

The supporting substrate 48a is layered sandwiching the supporting substrate 46a so as to oppose the supporting substrate 47a. Also, a strip line 48b is formed on a face opposing a face that contacts the supporting substrate 46a on the supporting substrate 48a, and a through-hole reaching the other face of the supporting substrate 48a is formed on one end of the strip line 48b. The strip line 48b is connected to the coplanar line 45c via a through-hole 48d and a through-hole 46d.

A spacer 49a and a spacer 49b are arranged between the dielectric substrate 42 and the supporting member 46 and between dielectric substrate 43 and the supporting member 46, respectively; and gaps therebetween are maintained at a constant spacing. The spacer 49b between the dielectric substrate 42 and the supporting member 46 has the same height as the combined heights of the supporting substrate 47a and the spacer 49a and is arranged so that the dielectric substrate 42 and the supporting member 46 are parallel with each other. Similarly, the spacer 49b between the dielectric substrate 43 and the supporting member 46 has the same height as the combined heights of the supporting substrate 48a and the spacer 49a and is arranged so that the dielectric substrate 43 and the supporting member 46 are parallel with each other.

By configuring the device as above, two filters can be obtained: one filter having three resonating sections formed on the dielectric substrate 42, and another filter having resonating sections on the dielectric substrate 43. At this time, if the coplanar line 45c is connected to an antenna, the coplanar line 45c is connected to a receiver, and coplanar line 45b is connected to a transmitter, the dielectric duplexer 41 can be used as an antenna-sharing device.

For reference, although the coplanar lines are used as an input/output structure in the second and third embodiments, they are not restricted thereto, and other lead lines, such as strip lines, microstrip lines, or slot lines, may be formed. As an alternative input/output structure, a loop, a probe, or the like may be formed as a separate structure.

Figure 7:
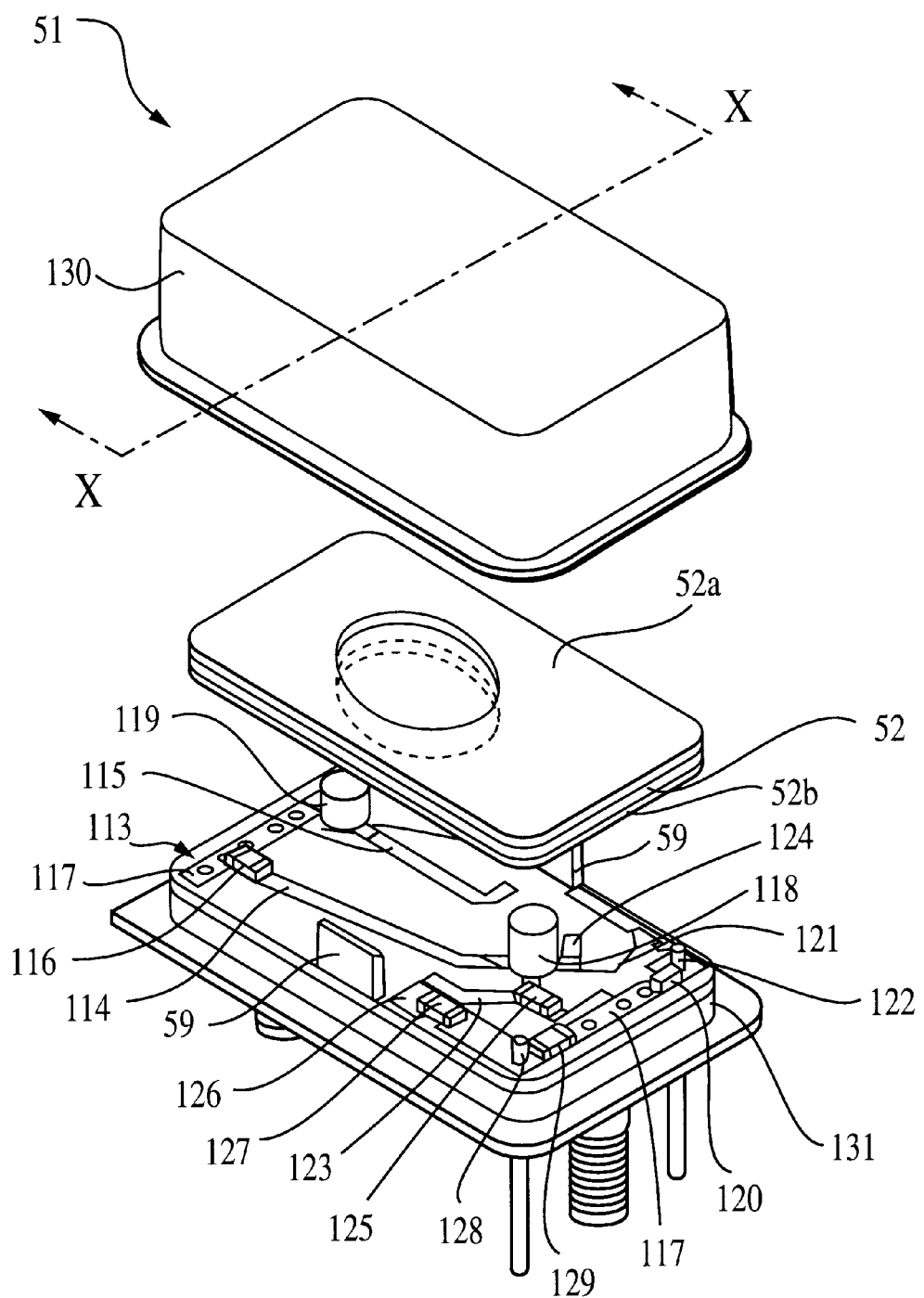
FIG. 7 is an exploded perspective view of a voltage-controlled oscillator according to a fourth embodiment.
Figure 8:
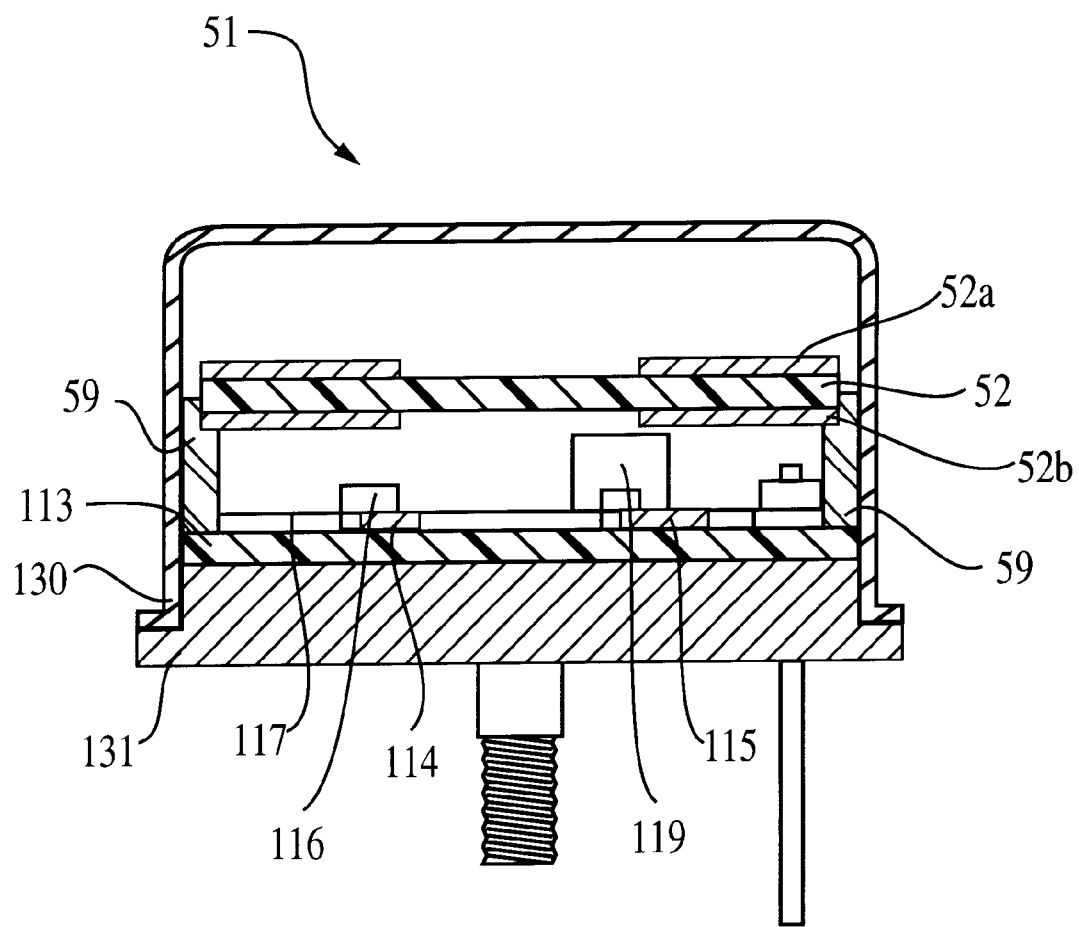
FIG. 8 is a cross-sectional view along the X—X-line in FIG. 7.
Figure 13:
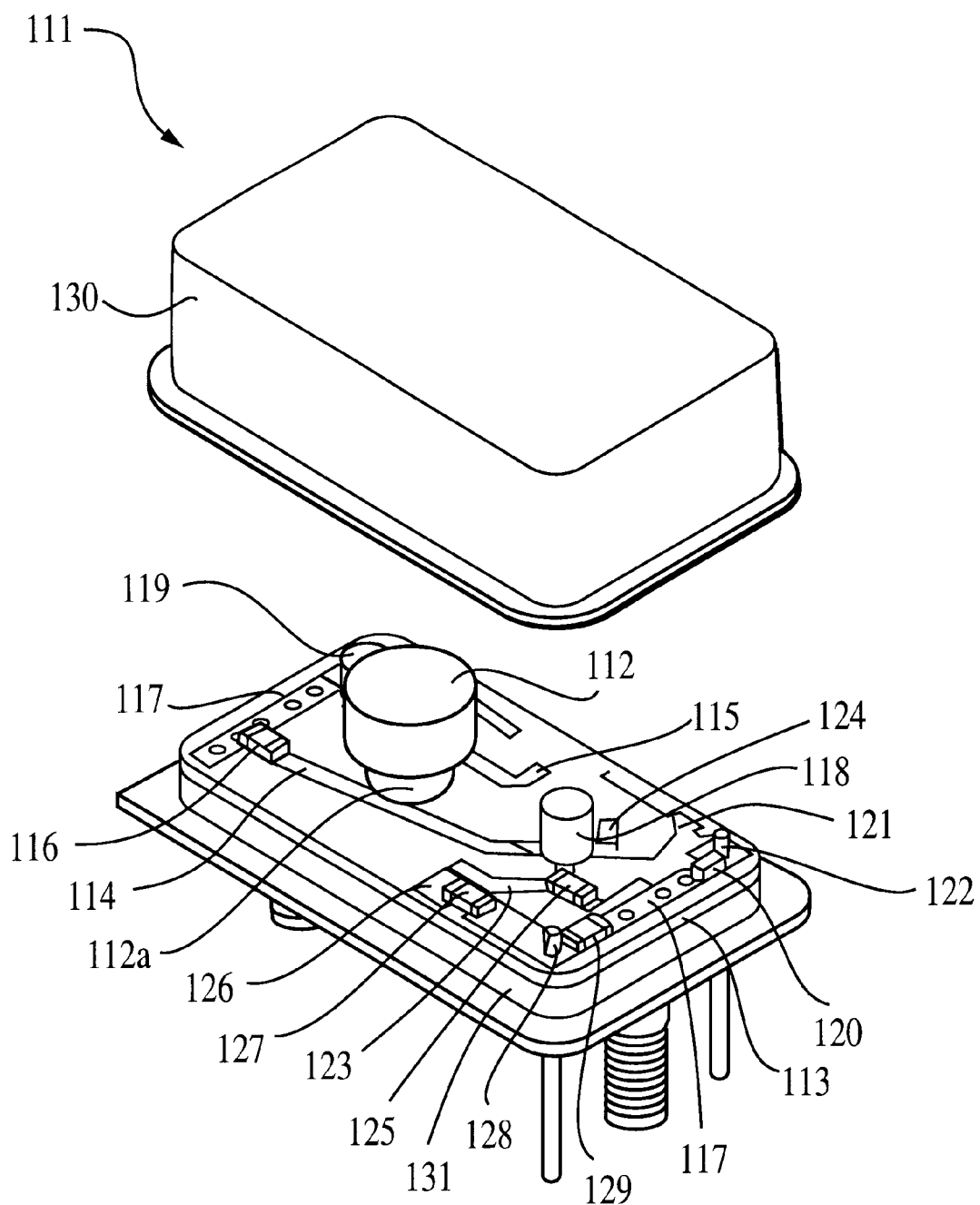
FIG. 13 is an exploded perspective view of a conventional voltage-controlled oscillator.

Next, using FIGS. 7 and 8, a fourth embodiment is described below. FIG. 7 is an exploded perspective view of a voltage-controlled oscillator according to the fourth embodiment; FIG. 8 is a cross-sectional view taken along the line X—X in FIG. 7. For the same parts as those of the conventional voltage-controlled oscillator 111 shown in FIG. 13, the same symbols are given, and a detailed description is omitted.

As shown in FIG. 7, a voltage-controlled oscillator 51 is composed of a dielectric substrate 52, a wiring substrate 113 which is a supporting member, and an upper metal housing 130 and a lower metal housing 131 which are conductor plates.

The dielectric substrate 52 has a constant relative dielectric constant, on which electric conductors 52a and 52b having circular openings on their two main faces are formed so that the openings on the two main faces oppose each other. The size of the openings in the electric conductors 52a and 52b of the dielectric substrate 52 is defined in accordance with a predetermined frequency. A resonating section is arranged by the openings.

On the wiring substrate 113, a microstrip line 114 forming a primary line, and a microstrip line 115 forming a secondary line, are formed so as to overlap with the opening in the electric conductor 52b of the dielectric substrate 52 as viewed from top to bottom in FIG. 7.

A spacer 59 of a low dielectric constant is arranged on the wiring substrate 113, and as shown in FIG. 8, it is immobilized so that the dielectric substrate 52 and the wiring substrate 113 are arranged at a constant spacing.

As described above, in the configuration of this embodiment, compared to conventional configurations, the thickness of the resonating section can be reduced; accordingly, the height of the voltage-controlled oscillator can also be reduced, compared to the conventional configuration. That is, compared to conventional TE01δ-mode dielectric resonators, either the thickness of the resonator or the space necessary for resonance is less, and the height of the voltage-controlled oscillator can be reduced.

Figure 9:
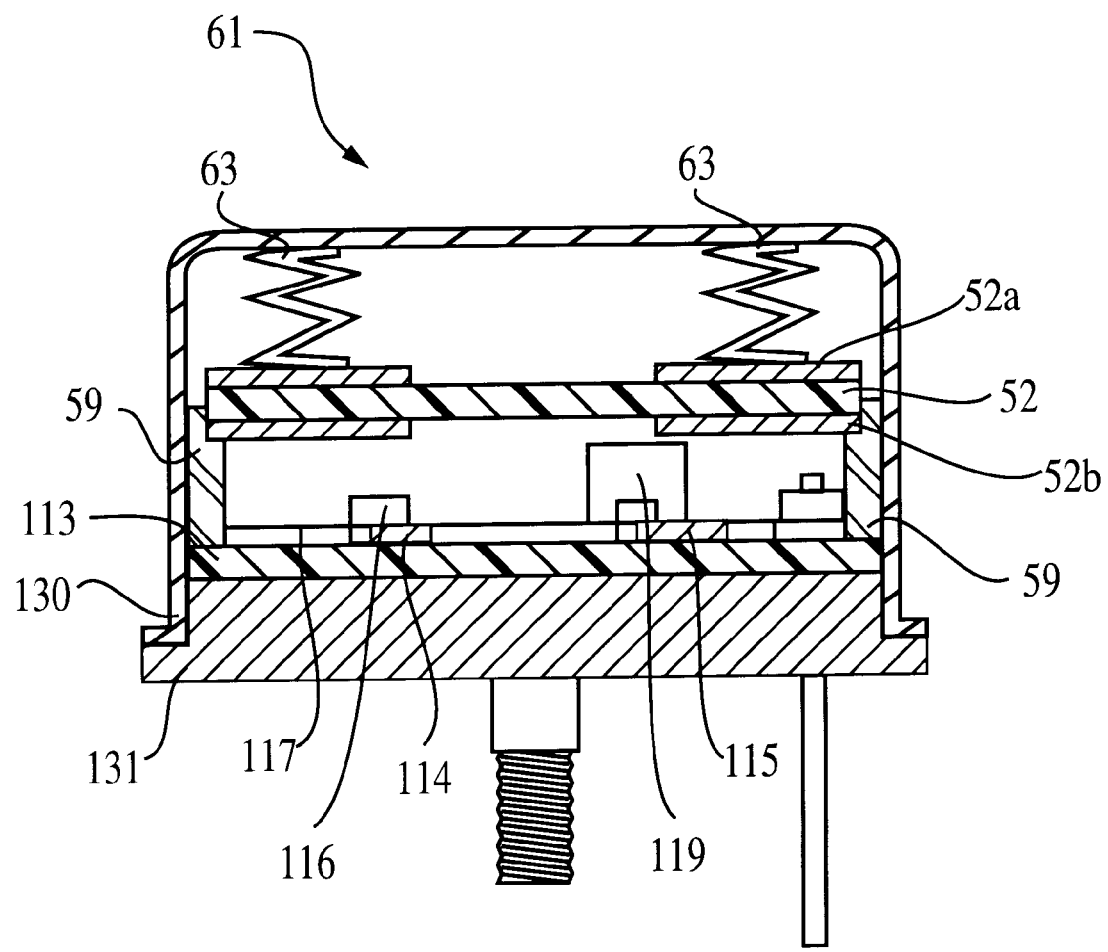
FIG. 9 is a cross-sectional view of a voltage-controlled oscillator according to a first modification example of the fourth embodiment.

Next, using FIG. 9, a first modification example of the fourth embodiment is described below. FIG. 9 is a cross-sectional view of a voltage-controlled oscillator in the same portion as that in FIG. 8. For the same parts as those of the conventional voltage-controlled oscillator 111 shown in FIG. 13 and the voltage-controlled oscillator of the fourth embodiment which is shown in FIG. 7, the same symbols are given, and a detailed description is omitted.

The difference from the fourth embodiment in FIG. 7 is that a voltage-controlled oscillator 61 of this modification example has leaf spring 63.

As shown in FIG. 9, an electric conductor 2*a* of a dielectric substrate 52 is electrically connected via the leaf spring 63 to a ceiling face of an upper metal housing 130. When the upper metal housing 130 is engaged with a lower metal housing 131, the leaf spring 63 is bent and pressed to urge the dielectric substrate 52 so as to immobilize the dielectric substrate 52. In this way, the electric conductor 52*a* of the dielectric substrate 52 and the upper metal housing 130 are maintained in electrical contact by the leaf spring 63, and they are immobilized when their electrical potentials are the same; therefore, a stable oscillation frequency can be obtained.

The reason is that without the leaf spring, the distance between the dielectric substrate 52 and the upper metal housing 130 varies, causing electromagnetic-field distribution to be divergent between the upper and lower conductor housings 130 and 131. When the electromagnetic-field distribution will be divergent within the upper and lower housings 130 and 131, an undesirable frequency approaches a pass-through region of a resonating section formed on the dielectric substrate 52, and undesirable frequencies might be generated. In this modification example, such undesirable frequencies are avoided by the leaf spring 63.

For reference, in this modification example, the leaf spring having electrical conductivity is used to connect the dielectric substrate 52 and the upper metal housing 130; however, an arrangement may be such that the spacer 59 formed of a conductive material is connected to the upper conductor housing 131. In other words, as long as the upper and lower conductor housings are electrically connected, any other configuration may be used to avoid undesirable oscillation.

Figure 10:
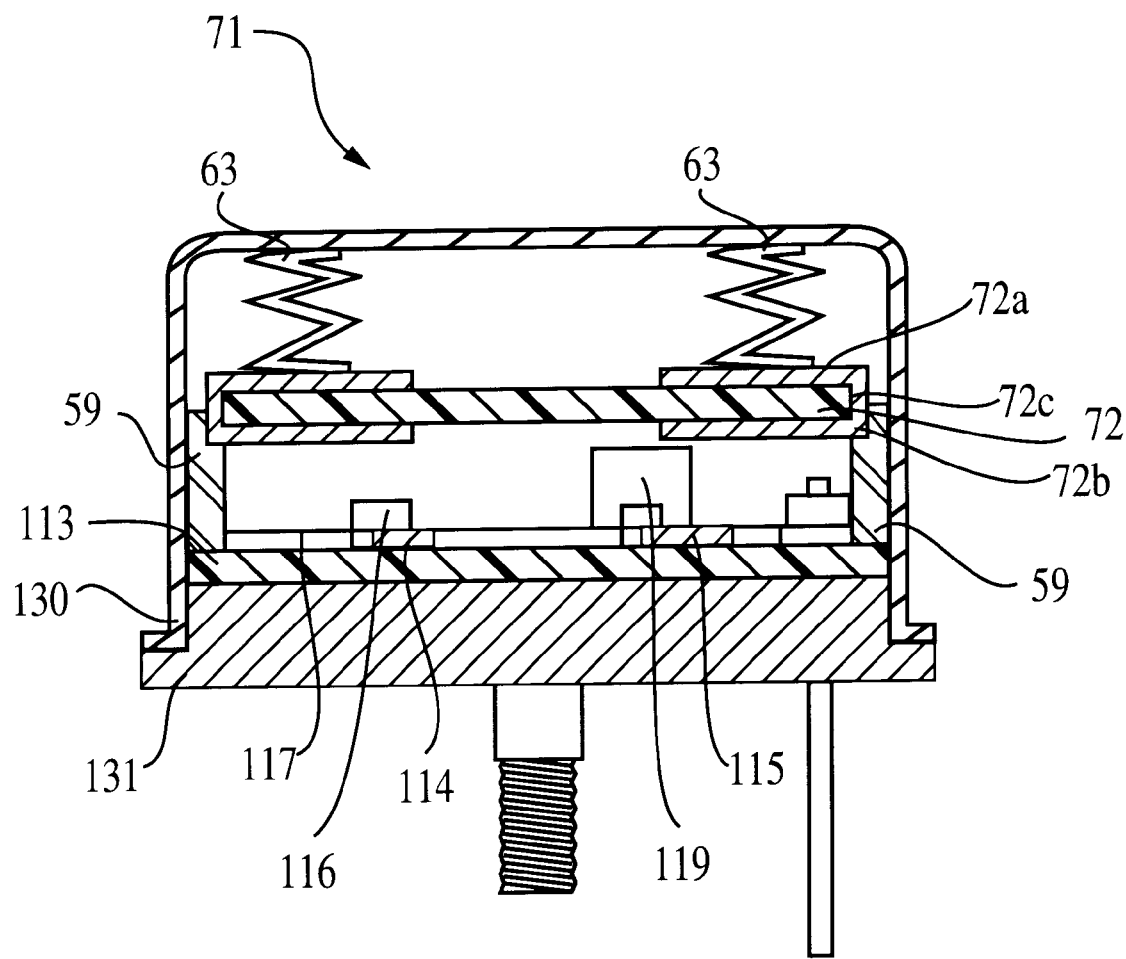
FIG. 10 is a cross-sectional view of a voltage-controlled oscillator according to a second modification example of the fourth embodiment.

In addition, using FIG. 10, a second modification example of the fourth embodiment is described below. FIG. 10 is a cross-sectional view of a voltage-controlled oscillator in the same portion as that in FIG. 8. For the same parts as those of the conventional voltage-controlled oscillator 111 shown in FIG. 13 and the voltage-controlled oscillator according to the first modification example of the fourth embodiment shown in FIG. 9, the same symbols are given, and a detailed description thereof is omitted.

The difference from the first modification example of the fourth embodiment in FIG. 9 is that a voltage-controlled oscillator 71 of this modification example has a short conductor 72*c* formed on a dielectric substrate 72.

As shown in FIG. 10, the dielectric substrate 72 has a constant relative dielectric constant, on which electric conductors 72*a* and 72*b* having openings on their two main faces are formed so that the openings on the two main faces oppose each other. The size of the openings in the electric conductors 72*a* and 72*b* of the dielectric substrate 72 is defined in accordance with a predetermined frequency. A resonating section is arranged by these openings. Also, the electric conductors 72*a* and 72*b* are connected via the short conductor 72*c* formed on a side face of the dielectric substrate 72.

The electrical connection between the electric conductor 72*a* and the electric conductor 72*b* of the dielectric substrate 72, as described above, allows even vertical electromagnetic-field distribution viewed from the center of the thickness direction of the dielectric substrate 72. Therefore, a stable oscillation frequency can be obtained.

The reason is that if the electric conductor 72*a* and the electric conductor 72*b* are not electrically connected, the vertical electromagnetic-field distribution viewed from the center in the thickness direction of the dielectric substrate 72 is caused to be heterogeneous. That is, when the vertical electromagnetic-field distribution viewed from the center in the thickness direction of the dielectric substrate 72 will be heterogeneous, an undesirable frequency approaches a pass-through region of the resonating section formed on the dielectric substrate 72, and an undesirable-frequency oscillation may occur. In this modification example, such an undesirable-frequency oscillation is avoided by the short conductor 72.

Figure 11:
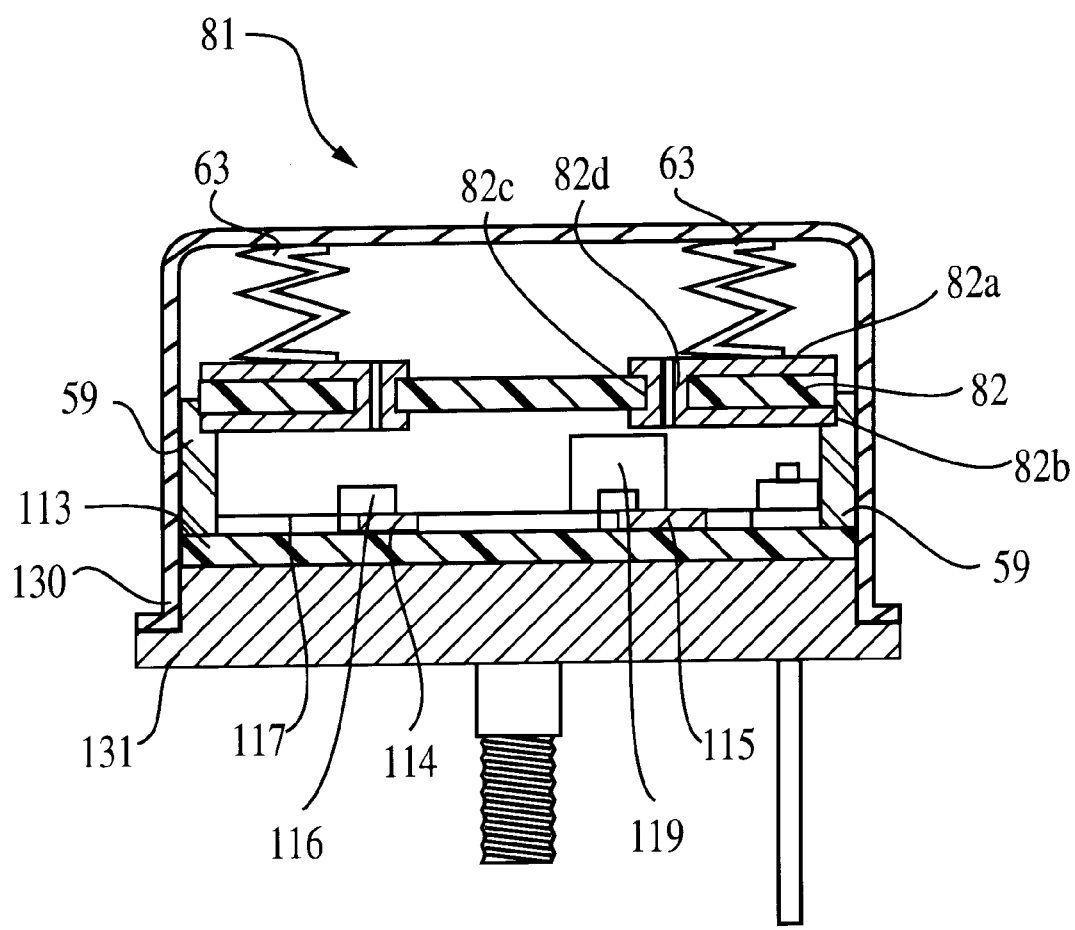
FIG. 11 is a cross-sectional view of a voltage-controlled oscillator according to a third modification example of the fourth embodiment.
Figure 12:
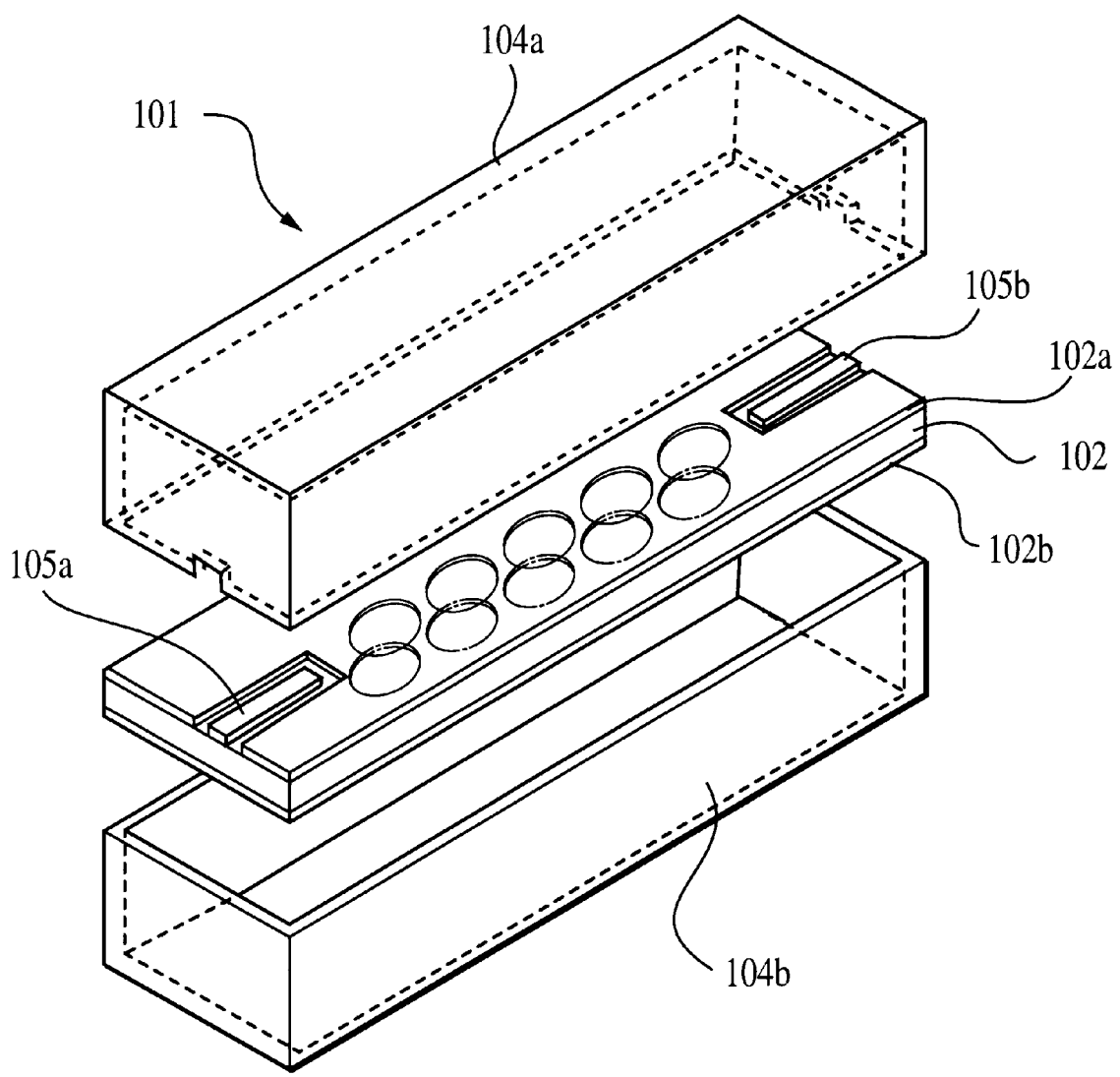
FIG. 12 is an exploded perspective view of a dielectric filter previously proposed by the present applicant.

In addition, a fourth modification example of the fourth embodiment is described below using FIG. 11. FIG. 11 is a cross-sectional view of a voltage-controlled oscillator in the same portion as that in FIG. 8. For the same parts as those of the conventional voltage-controlled oscillator 111 shown in FIG. 13 and the voltage-controlled oscillator according to the first modification example of the fourth embodiment which is shown in FIG. 9, the same symbols are given, and a detailed description is omitted.

The difference from the first modification example of the fourth embodiment in FIG. 9 is that a voltage-controlled oscillator 81 of this modification example has a through-hole 82*c* and a short conductor 82*d* in a dielectric substrate 82.

As shown in FIG. 11, the dielectric substrate 82 has a constant relative dielectric constant, on which electric conductors 82*a* and 82*b* having openings on their two main faces are formed so that the openings on the two main faces oppose each other. The size of the openings in the electric conductors 82*a* and 82*b* of the dielectric substrate 82 is defined in accordance with a predetermined frequency. A resonating section is arranged by the openings.

Also, the through-hole 82*c* passing through in the thickness direction is formed in the dielectric substrate 82, and the short conductor 82*d* is formed on an inner peripheral face of the through-hole. The electric conductors 82*a* and 82*b* of the dielectric substrate 82 are electrically connected by the short conductor 82*d*.

The configuration described above allows the same effects as in the second modification example of the fourth embodiment, which is shown in FIG. 10, to be provided. For reference, description have been made regarding the fourth embodiment and modification examples thereof which use the voltage-controlled oscillator; however, there is no such restriction, and a standard resonator configuration, for example, without a function allowing the resonance frequency to be variable, may be made.

In the first, second, third, and fourth embodiments, spacers are used to have a constant distance between the dielectric substrate and the supporting member; however, there is no such a restriction. The only requirement is to have a constant distance between the aforementioned items; therefore, other arrangements are possible. For example, a configuration may be made using a conductor plate larger than items such as a dielectric substrate and a supporting member to allow accommodation therein, and protrusions or the like are arranged at inner walls in order to hold the dielectric substrate, the supporting member, and the like, respectively, with a constant distance. The only requirement is to maintain the space therebetween constant. Also, the shape of the spacers may be of any shape.

As described above, according to embodiments of the present invention, circuit elements, such as resonators and lead lines, which are conventionally arranged on the same dielectric substrate, are configured separately on a dielectric substrate and a supporting member; in this way, overall horizontal dimension of items such as the dielectric resonator and the dielectric filter can be reduced.

In particular, in embodiments of the present invention a plurality of supporting members is used to separately arrange the circuit elements. This allows further reduction of the overall horizontal dimension of the components.

In embodiments of the present invention resonating sections are also arranged in a supporting member so that the resonating sections of the supporting member overlap with resonating sections of the dielectric substrate. In this case, the distance between the resonating sections formed on the dielectric substrate and the resonating sections formed on the supporting member can be reduced, strengthening coupling between the resonating sections.

In embodiments of the present invention input/output lead lines, which were conventionally formed on the same dielectric substrate, are formed on a separate supporting member. Therefore, the horizontal dimension in a component-mounted state can be reduced.

In embodiments of the present invention the horizontal dimension of indirect-coupling lead lines can also be reduced in a component-mounted state, compared to the conventional configuration in which the lead lines are formed on the same dielectric substrate.

In embodiments of the present invention a resonating section arranged by formation of an electric conductor having openings on a dielectric substrate is used, the thickness of the dielectric substrate is smaller than in the case of a conventional TE01δ-mode dielectric resonator. Accordingly, compared to the conventional resonator, the invention can be made thinner and can be made smaller overall. In addition, since the resonating section arranged by formation of the electric conductor having the openings on the dielectric substrate is used, electromagnetic-field confinement is good, coupling only with electrodes arranged in the vicinity of the openings, not with other electrodes. Therefore, since other electrodes can be arranged in any place except the vicinity of the openings, this allows freer wiring design.

In embodiments of the present invention since an electric conductor of a dielectric substrate is electrically connected to a conductor plate, stable oscillation frequency characteristics can be obtained. In addition, in embodiments of the present invention electric conductors in two main faces of a dielectric substrate are electrically connected, oscillation frequency characteristics can be obtained.

INDUSTRIAL APPLICABILITY

As is apparent in the above description, the dielectric resonator, dielectric filter, dielectric duplexer, and oscillator according to the present invention may be widely used, for example, in terminals of mobile communication systems, in various electronic devices of base stations, and the like.

What is claimed is:

1. A dielectric resonator characterized by comprising:

a dielectric substrate, a first electric conductor formed on one main face of the dielectric substrate, a second electric conductor formed on the other main face of the dielectric substrate, a first opening formed in the first electric conductor so that the dielectric substrate is exposed by the first electric conductor, a second opening formed in the second electric conductor so that the dielectric substrate is exposed by the second electric conductor, a first electric conductor plate spaced apart from the first electric conductor so as to cover at least the first opening, a second electric conductor plate spaced apart from the second electric conductor so as to cover at least the second opening, a resonating section defined by the first opening and the second opening, a supporting member spaced apart from the dielectric substrate in the thickness direction of the dielectric substrate, and at least one electrode formed on the supporting member.

2. A dielectric resonator as stated in claim 1, characterized in that a plurality of the supporting members is arranged in the thickness direction of the dielectric substrate for the dielectric substrate.

3. A dielectric resonator as stated in claim 1 or claim 2, characterized in that lead lines are arranged by the electrodes.

4. A dielectric resonator as stated in claim 1 or claim 2, characterized in that the at least one electrode is a frequency-modulating electrode.

5. A dielectric filter characterized by comprising:

a dielectric substrate, a first electric conductor formed on one main face of the dielectric substrate, a second electric conductor formed on the other main face of the dielectric substrate, a first opening formed in the first electric conductor so that the dielectric substrate is exposed by the first electric conductor, a second opening formed in the second electric conductor so that the dielectric substrate is exposed by the second electric conductor, a first conductor plate spaced apart from the first electric conductor so as to cover at least the first opening, a second electric conductor plate spaced apart from the second electric conductor so as to cover at least the second opening, a resonating section defined by the first opening and the second opening, a supporting member spaced apart from the dielectric substrate in the thickness direction of the dielectric substrate, and at least one electrode formed on the supporting member.

6. A dielectric filter as stated in claim 5, characterized in that input/output terminal electrodes for performing electromagnetic-field coupling are arranged by the electrodes at the resonating sections.

7. A dielectric filter as stated in claim 5, characterized in that the at least one electrode is a frequency-modulating electrode.

8. A dielectric filter as stated in claim 5, characterized in that the supporting member is a dielectric substrate, respective electrodes are formed on two main faces of the supporting member, openings are formed in the electrodes on the two main faces, and a resonating section is formed by the openings.

9. A dielectric filter as stated in claim 5, claim 6, claim 7, or claim 8, characterized in that a plurality of the first openings and a corresponding plurality of the second openings exist, so that a plurality of the resonating sections are defined respectively by the first openings and the corresponding second openings.

10. A dielectric filter as stated in claim 9, characterized in that coupling electrodes for coupling the plurality of resonating sections via an electromagnetic field are formed on the supporting member.

11. A dielectric filter as stated in claim 5, claim 6, claim 7, or claim 8, characterized in that a plurality of the supporting members is arranged in the direction of the dielectric substrate with respect to the dielectric substrate.

12. A dielectric duplexer characterized by comprising:
  a dielectric substrate,
  a first electric conductor formed on one main face of the dielectric substrate,
  a second electric conductor formed on the other main face of the dielectric substrate,
  a plurality of first openings formed in the first electric conductor,
  a corresponding plurality of second openings formed in the second electric conductor,
  a first conductor plate spaced apart from the first electric conductor so as to cover at least the plurality of first openings,
  a second conductor plate spaced apart from the second electric conductor so as to cover at least the plurality of second openings,
  a plurality of resonating sections defined respectively by the plurality of first openings and the corresponding plurality of second openings,
  a first filter composed of a first group of the plurality of resonating sections,
  a second filter composed of a second group of the plurality of resonating sections which comprises resonating sections different from those in the first group,
  a supporting member spaced apart from the dielectric substrate in the thickness direction of the dielectric substrate, and
  at least one electrode formed on the supporting member.

13. A dielectric duplexer as stated in claim 12, characterized by comprising:
  a first input/output terminal electrode composed of an electrode and coupled to at least one resonating section of the first resonating section group via an electromagnetic field,
  a second input/output terminal electrode composed of an electrode and coupled to at least one resonating section of the second resonating section group via an electromagnetic field, and
  a third input/output terminal electrode composed of an electrode and coupled to at least one resonating section of the first resonating section group and to at least one resonating section of the second resonating section group via an electromagnetic field.

14. A dielectric duplexer as stated in claim 12 or claim 13, characterized in that the at least one electrode is a frequency-modulating electrode.

15. A dielectric duplexer as stated in claim 12, characterized in that the supporting member is a dielectric substrate, respective electrodes are formed on two main faces of the supporting member, openings are formed on the electrodes on the two main faces, and a resonating section is formed by the openings.

16. A dielectric duplexer as stated in claim 12, claim 13, or claim 15, characterized in that a plurality of the first openings and a plurality of the second openings exist, so that a plurality of the resonating sections defined by the first openings and the second resonating sections exist.

17. A dielectric duplexer as stated in claim 16, characterized in that coupling electrodes for coupling the plurality of resonating sections via an electromagnetic field are formed on the supporting member.

18. A dielectric duplexer as stated in claim 12, claim 13, claim 15, or claim 17, characterized in that a plurality of the supporting members is arranged in the direction of the dielectric substrate with respect to the dielectric substrate.

19. An oscillator characterized by comprising:
  a dielectric substrate,
  a first electric conductor formed on one main face of the dielectric substrate,
  a second electric conductor formed on the other main face of the dielectric substrate,
  a first opening formed in the first electric conductor,
  a second opening formed in the second electric conductor,
  a first electric conductor plate spaced apart from the first electric conductor so as to cover at least the first opening,
  a second electric conductor plate spaced apart from the second electric conductor so as to cover at least the second opening,
  a resonating section defined by the first opening and the second opening,
  a supporting member spaced apart from the dielectric substrate in the thickness direction of the dielectric substrate,
  a primary line formed on the supporting member and composing a resonant circuit electromagnetically coupled to the resonating section, and
  a negative resistor circuit connected to the resonant circuit.

20. An oscillator as stated in claim 19, characterized in that the resonant circuit comprises a variable oscillation frequency circuit.

21. An oscillator as stated in claim 20, characterized in that the variable oscillation frequency circuit is controlled by voltage.

22. An oscillator as stated in claim 19, claim 20, or claim 21, characterized in that at least either one of the first electric conductor and the second electric conductor of the dielectric substrate is connected to the first conductor plate or the second conductor plate.

23. An oscillator as stated in claim 19, claim 20, or claim 21, characterized in that the first electric conductor and the second electric conductor of the dielectric substrate are connected.

24. A dielectric filter as stated in claim 9, characterized in that a plurality of the supporting members is arranged in the direction of the dielectric substrated with respect to the dielectric substrate.

25. A dielectric duplexer as stated in claim 14, characterized in that a plurality of the first openings and a plurality of the second openings exist, so that a plurality of the resonating sections defined by the first openings and the second resonating sections exist.

26. A dielectric duplexer as stated in claim 15, characterized in that coupling electrodes for coupling the plurality of resonating sections via an electromagnetic field are formed on the supporting member.

27. A dielectric duplexer as stated in claim 26, characterized in that a plurality of the supporting members is arranged in the direction of the dielectric substrate with respect to the dielectric substrate.

28. A dielectric duplexer as stated in claim 25, characterized in that a plurality of the supporting members is arranged in the direction of the dielectric substrate with respect to the dielectric substrate.

29. A dielectric duplexer as stated in claim 16, characterized in that a plurality of the supporting members is arranged in the direction of the dielectric substrate with respect to the dielectric substrate.

30. A dielectric duplexer as stated in claim 14, characterized in that a plurality of the supporting members is arranged in the direction of the dielectric substrate with respect to the dielectric substrate.

31. An oscillator as stated in claim 22, characterized in that the first electric conductor and the second electric conductor of the dielectric substrate are connected.

* * * * *